United States Patent [19]
Chung et al.

[11] Patent Number: 5,012,246
[45] Date of Patent: Apr. 30, 1991

[54] BICMOS ANALOG-TO-DIGITAL CONVERTER WITH MINIMIZED METASTABILITY

[75] Inventors: Paul W. Chung, San Jose; Karl R. Hense, Los Altos, both of Calif.; Kim Y. Nguyen, Williston, Vt.

[73] Assignee: International Business Machines Corporation, Armonk, N.Y.

[21] Appl. No.: 472,974

[22] Filed: Jan. 31, 1990

[51] Int. Cl.⁵ .............................................. H03M 1/36
[52] U.S. Cl. ....................................... 341/160; 341/94
[58] Field of Search ................. 341/94, 118, 133, 134, 341/135, 136, 155, 159, 160; 307/272.2, 443, 475

[56] References Cited

U.S. PATENT DOCUMENTS

| | | | |
|---|---|---|---|
| 4,211,999 | 7/1980 | Clark et al. | 341/160 |
| 4,276,543 | 6/1981 | Miller et al. | 341/159 |
| 4,301,381 | 11/1981 | Clemen et al. | 307/475 |
| 4,586,025 | 4/1986 | Knierim | 341/160 |
| 4,712,087 | 12/1987 | Traa | 341/160 |
| 4,733,220 | 3/1988 | Knierim | 341/96 |
| 4,808,840 | 2/1989 | Chung et al. | 307/290 |
| 4,816,702 | 3/1989 | Salina et al. | 307/272.2 |
| 4,884,075 | 11/1989 | Mangelsdorf | 341/159 |
| 4,897,657 | 1/1990 | Brubaker | 341/96 |
| 4,918,451 | 4/1990 | Ando et al. | 341/155 |

FOREIGN PATENT DOCUMENTS

56-16322  2/1981  Japan ................................. 341/133

Primary Examiner—William M. Shoop, Jr.
Assistant Examiner—Howard L. Williams
Attorney, Agent, or Firm—Henry E. Otto, Jr.

[57] ABSTRACT

A high performance, low power analog to digital converter is designed in BIFET technology utilizing the high gain, high performance of a bipolar comparator and the low power of a CMOS latch and CMOS encoding logic circuits. Using a FET dynamic latch, metastability is avoided, significantly reducing soft error rate.

9 Claims, 3 Drawing Sheets

BICMOS ANALOG-TO-DIGITAL CONVERTER WITH MINIMIZED METASTABILITY

This invention relates to analog-to-digital converters (ADCs) and more particularly to a high-performance low-power ADC and conversion method wherein soft error rate due to metastability is virtually eliminated and protection is provided against errors due to noise or propagation delays.

BACKGROUND OF THE INVENTION

Japanese application, Ser. No. 54-92061 published Feb. 17, 1981, describes an ADC comprising a bipolar transistor in combination with CMOS field effect transistors (FET) to provide high performance and low power consumption. More specifically, the output from a bipolar comparator is supplied by way of a single static latch and a two-input AND gate to the CMOS FET. This ADC does not address or improve soft error rate or metastability or provide protection against errors due to noise or propagation delays.

SUMMARY OF THE INVENTION

An analog-to-digital converter is provided with minimized metastability. Each of a plurality of bipolar comparators provides from an analog data input a differential output signal. Each of a plurality of latch means provides from the signal of a corresponding comparator a respective one of a plurality of preselected equal-step binary levels. Each latch means includes a dynamic latch for sensing and amplifying a respective one of said signals to CMOS level, a static latch, and transfer gate means for transferring the respective one of said signals from the dynamic latch to the static latch only if such signal is not metastable. As illustrated, each of a plurality of AND gates has three inputs that consist of combinations of three adjacent binary levels that are output as a thermometer code by the plurality of latch means in combination for translating the data from thermometer code into a single one hot code. Each latch means also preferably comprises a second static latch which receives the output of the first-mentioned static latch to further decrease the probability of metastability and feeds the thermometer code to the AND gates. The binary output of each latch means is input to the dynamic latch of the adjacent latch means; and selectable binary scan data corresponding to a desired thermometer code or code sequence can be input under control of a scan clock for facilitating level sensitive scan design testing.

DESCRIPTION OF PREFERRED EMBODIMENT

Figure 1:
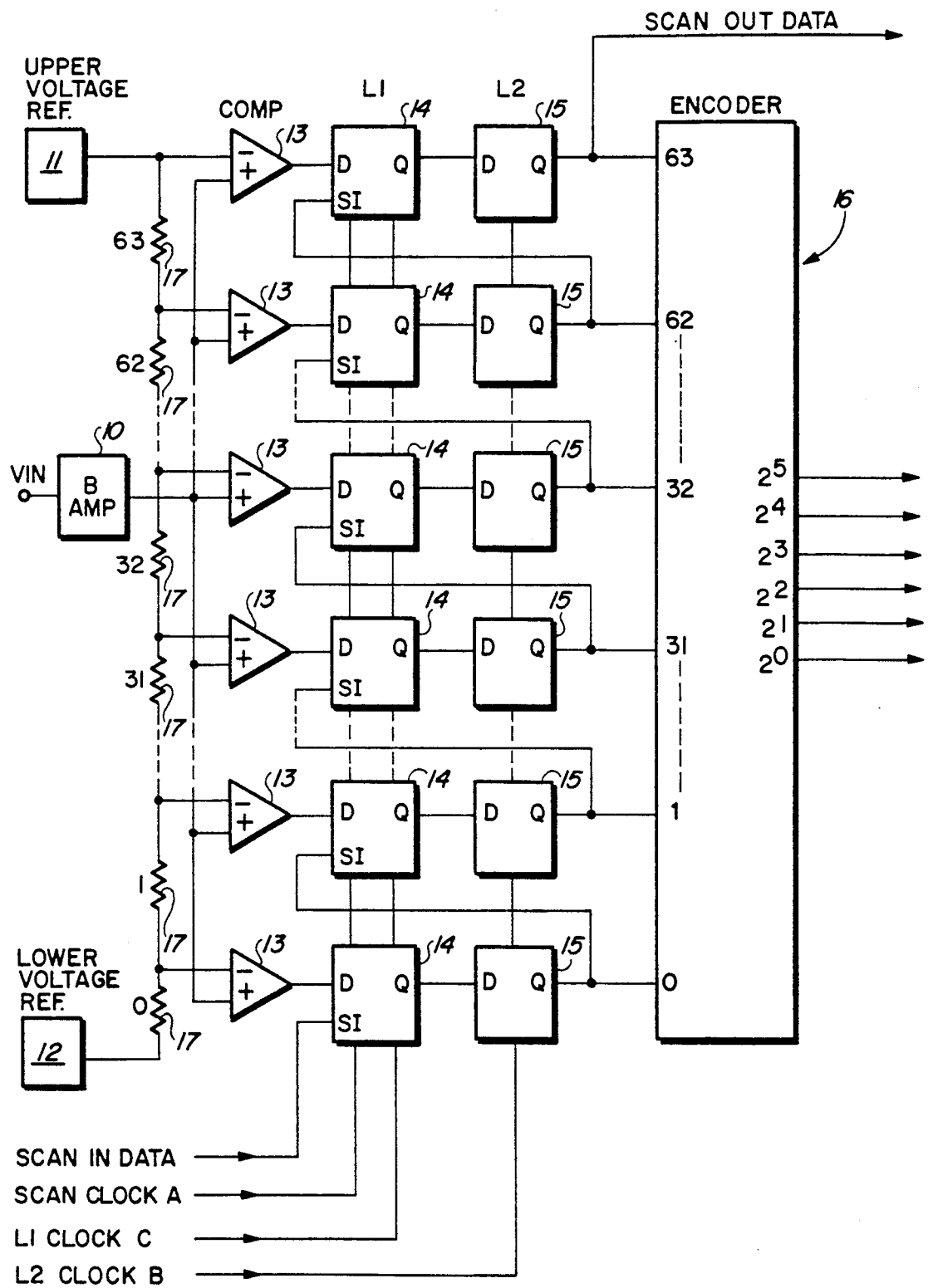
FIG. 1 is a block diagram of an ADC embodying the invention.

As illustrated in FIG. 1, the ADC embodying the invention comprises a buffer summing amplifier 10; upper and lower reference voltage sources 11,12; bipolar comparators 13; L1,L2 latches 14,15; and an encoder 16.

To facilitate understanding, the ADC as shown in FIG. 1 has 64 comparators 13, 64 L1 and L2 latches 14,15, and a 64-to-6 encoder 16.

Extending between upper and lower voltage sources 11,12 is a resistor string comprising 64 equal value resistors 17 that divide the voltage across the entire string into 63 equal voltage steps. Each of the 63 steps is connected to the reference input of a respective one of the comparators 13. The other input of each comparator 13 is connected to buffer amplifier 10.

The top and bottom of the resistor string are connected to the upper and lower reference voltage sources 11,12, respectively. The DC voltage is thus maintained within a preselected small range. The upper and lower reference voltage sources 11,12 supply approximately 2 v of reference voltage across the resistor string to provide an approximately 30 mv step at each resistor tap. The circuits are designed to have matched temperature coefficients so that the overall dependence on the temperature is minimal.

Each comparator 13 is basically a two-stage differential amplifier. The first stage receives the analog signal from buffer amplifier 10, compares it with the reference voltage derived from the resistor string, amplifies it and sends it to the second stage. The second stage of each comparator further amplifies the signal and drives it to the inputs of a dynamic latch 20 (FIG. 2) forming part of the associated L1 latch 14. This second stage provides the same amplification as the first stage but with more driving capability to overcome parasitic capacitance.

The amplification gain of each comparator 13 is chosen to guarantee that the output waveform will have an optimum rise time to trigger the dynamic latch 20 (now to be described), without paying the expense of high power dissipation. The output of each comparator 13 is a "1" if the input signal has a higher voltage than the reference voltage; otherwise the output is "0".

Since the output of each comparator 13 will be a "1" or a "0" depending upon whether the input signal is higher or lower than the reference voltage, the binary outputs of the comparators form a multi-level so-called "thermometer code". This thermometer code is converted by the L1 latches 14 into a "one hot code" to single out the transition point between the "1" and "0". Therefore, one and only one of the 63 binary voltage output levels of the L1 and L2 latches is (barring an error) at a "1" or "hot".

Figure 2:
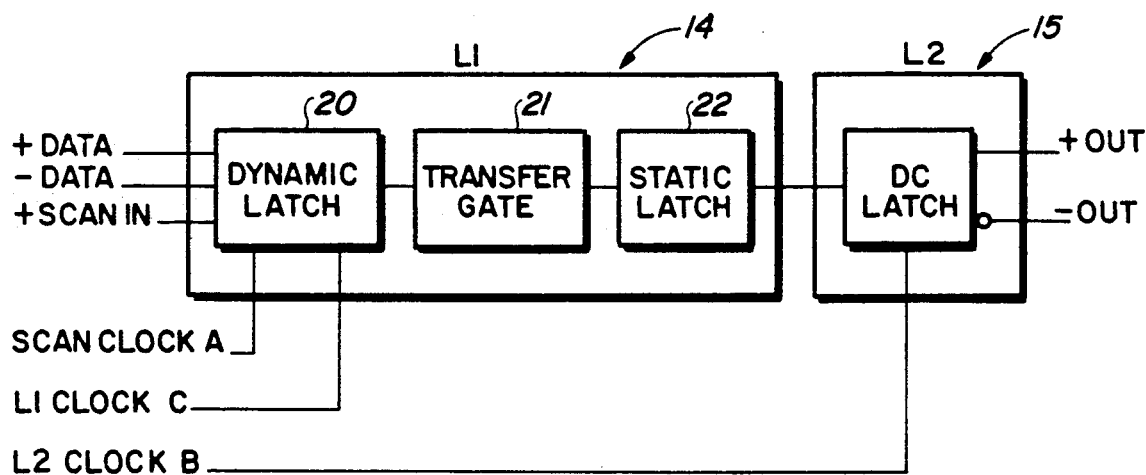
FIG. 2 is a block diagram in more detail of the latches shown in FIG. 1.

According to an important feature of the invention, each L1 latch 14 and its associated L2 latch 15 constitute a single macro. As best shown in FIG. 2, each L1 latch 14 consists of dynamic latch 20 followed by a transfer gate 21 and a static latch 22. Each dynamic latch 20 receives the data plus or minus output D from its corresponding comparator 13. Dynamic latch 20 and static latch 22 are both triggered by the leading edge of pulses from separate clocks C and B, respectively. The output Q of each static L1 latch 22 is fed to the input D of its corresponding L2 latch 15, which is a static latch. The output Q of each L2 latch is fed to encoder 16 in the manner presently to be described.

The combination of dynamic and static latches 20,22 substantially reduces the possibility of metastability. The combination of the L1 and L2 latches further significantly reduces and virtually eliminates metastability because the overall probability of metastability is equal to the metastable probability of the L1 latch times that of the L2 latch.

Figure 3:
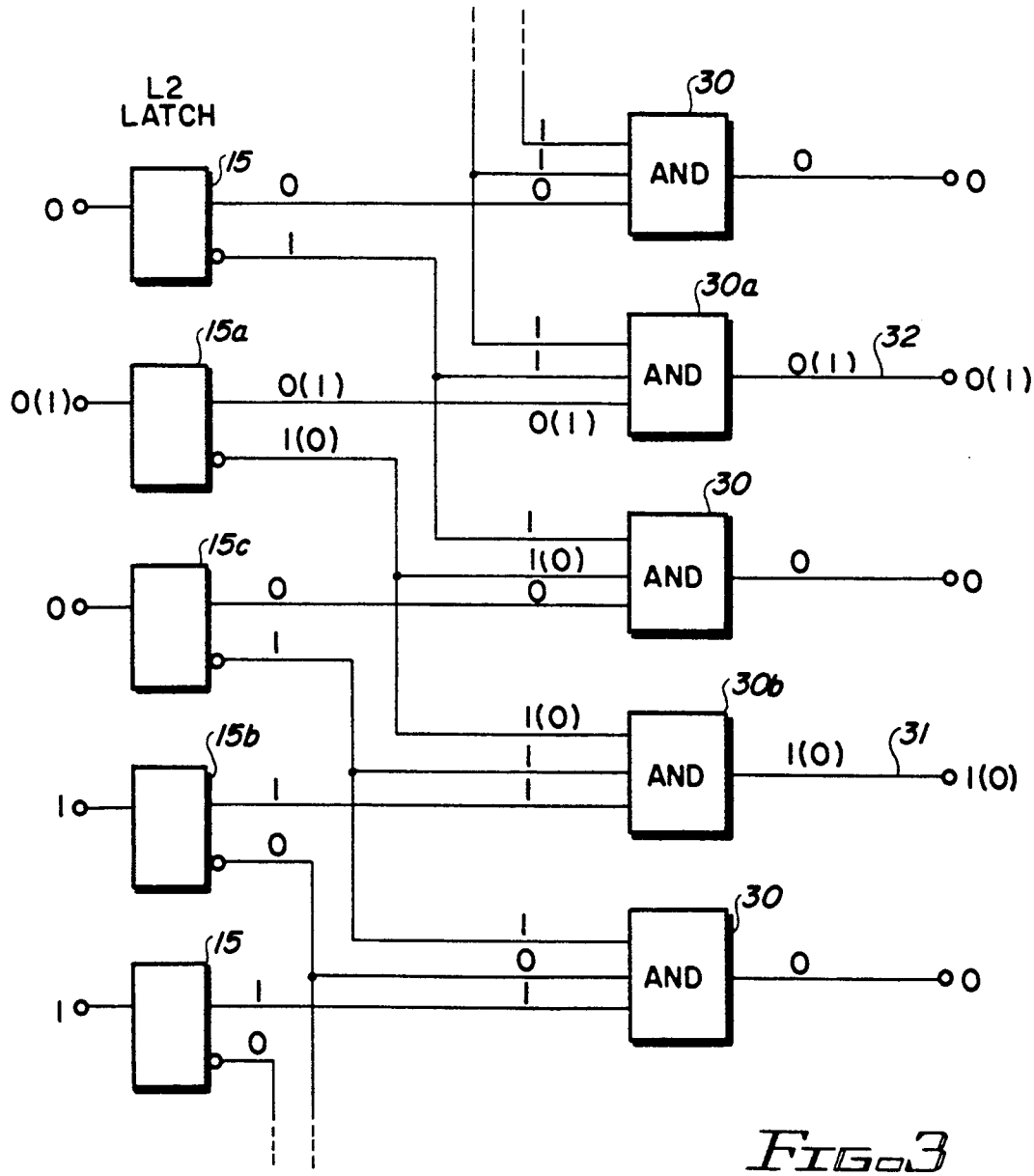
FIG. 3 is a schematic diagram showing how the latches are connected to provide protection against errors due to noise or propagation delay.

According to another important feature of the invention, and as illustrated in FIG. 3, errors due to noise on the resistor string or differences in propagation delays through the stages of the comparators 13 are minimized by inserting a three-way AND gate 30 between each L2 latch 15 and the encoder 16. (To simplify the drawings, these AND gates 30 are not shown in FIG. 1). These AND gates 30 assure that no more than a single one hot code input will be sent to encoder 16, in the following manner. One output of each L2 latch 15 is connected across to a respective one of the AND gates 30 and the other output of each L2 latch 15 is connected in parallel to two other respective AND gates 30 that are immediately to one side of that to which said one output is connected.

Initially, assume that the inputs to each illustrated L2 latch 15 (which inputs constitute part of the thermometer code) are as shown at the left of the respective latch. Under this assumed condition, the outputs of each illustrated latch 15 and the outputs of the respective AND gates 30 will be as shown, when all inputs and outputs in parentheses are disregarded. AND gates 30 will convert the thermometer code input to latches 15 into a one hot code output (i.e., a "1") in lead 31.

Assume now that an error, due to noise on the string of resistors 17 or to differences in propagation delays through the stages of comparators 13, causes an erroneous "1" input to latch 15a, as shown in parentheses, while the inputs to the other latches remain as before. There will now be two latches 15a and 15b with "1" outputs separated in the string by latch 15c with a "0" output. Despite this error, the interconnected three-way AND gates will assure that there will be only a single one hot code output to the encoder 16, this time in lead 32. This follows from the fact that the now "1" output of latch 15a will cause AND 30a to output a "1", while the now "0" output to AND 30b will change its output to "0".

The error illustrated involved a false "1" input to latch 15a, one latch in the string removed from the true "1" input to latch 15b. Note that by connecting each latch output to four (instead of three) adjacent four-way AND gates, the single one hot code output can be assured when a false "1" input is two latches removed from the true "1" input. Similarly if each latch output is connected to five adjacent five-way AND gates, a single one hot code will be assured with "1" inputs three latches 15 removed.

As illustrated, the false "1" bit becomes the single one hot code output because the output selected will always be the higher of the two binary levels corresponding to the respective "1" bit inputs to the latches 15. Thus, if the true input had been a "1" to latch 15a and the "1" input to latch 15b was false, then the single one hot code output would be in lead 32, corresponding to the true input. Irrespective, since there are 63 binary levels, any slight difference between the true and false outputs will be minimal; whereas without this error protection feature, large decoding errors could occur if there is more than one hot line input to encoder 16.

Thus the input analog signal will have been quantized into one of the 63 levels and converted into one hot code corresponding to that one level. Interconnecting the L2 latches with these AND gates in the manner just described thus assumes that only a single one hot code output will be fed to and encoded by encoder 16 into a six-bit two's complement binary number.

According to another feature of the invention and as best shown in FIG. 1, the combination of the L1 latch 14 and L2 latch 15 can desirably be used as a scan latch to perform a level sensitive scan design for debugging and testing the entire ADC design. To conduct such a test, scan data as a series of "1's" or "0's" is input at SI to that dynamic latch of L1 latch 14 which is connected to the comparator 13 at one end of the string during successive cycles of a scan clock A; and this data is then output from the corresponding L2 latch 15 as a scan data input SI for the adjacent dynamic latch. In this manner, scan data can be caused to correspond to any desired thermometer code value or sequence of such values to test and assure that only one hot code will be output to the encoder 16.

Figure 4:
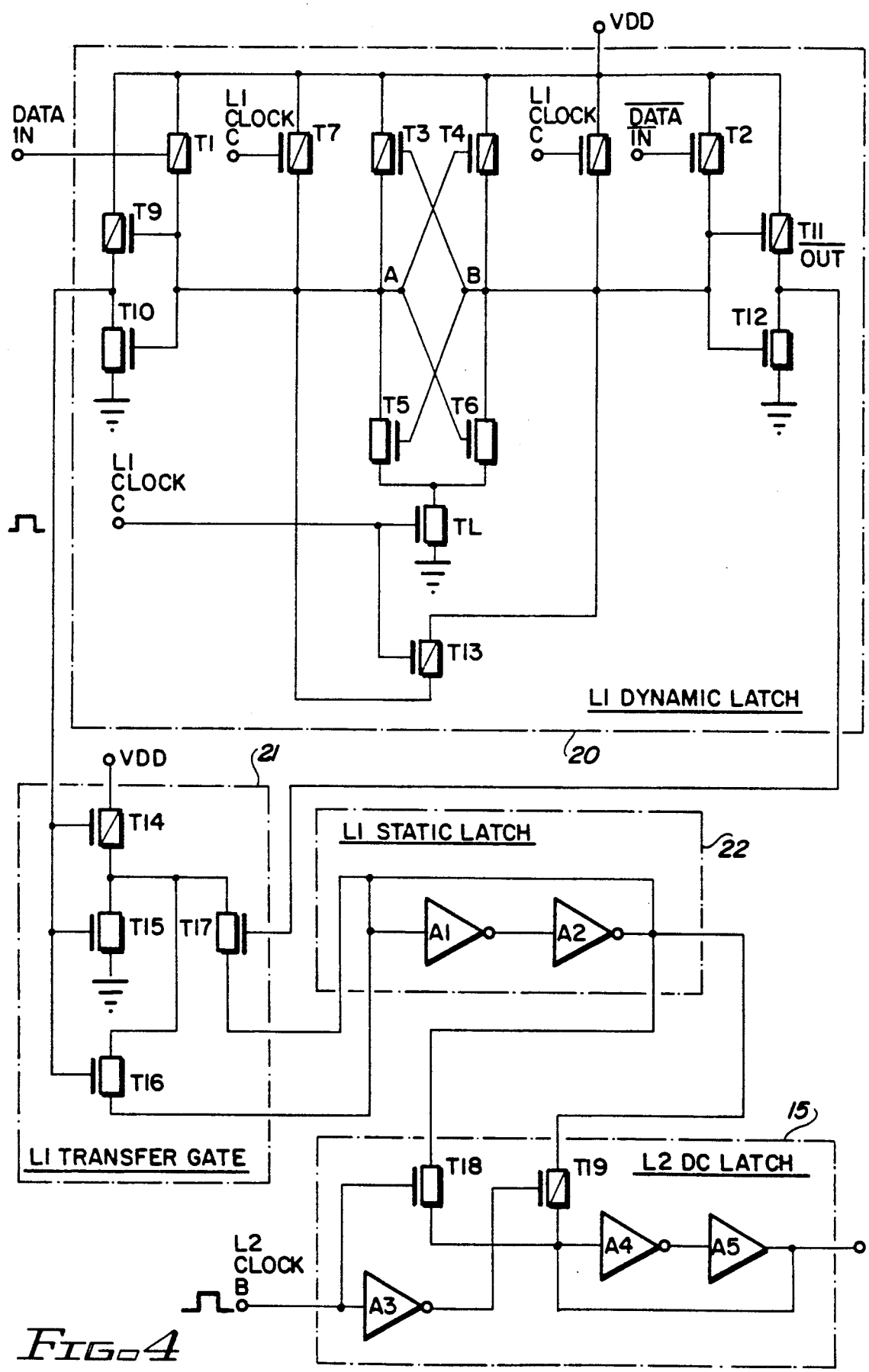
FIG. 4 is a circuit diagram of the latches of FIG. 2.

The preferred configuration and operation of the L1 and L2 latches will now be described. As illustrated in FIG. 4 and to facilitate understanding, p-channel field effect transistors (PFETs) are depicted with a diagonal slash; n-channel FETs (NFETs) are depicted without the slash; and FETs of either type are designated with the prefix T for brevity.

Each L1 dynamic latch 15 comprises T1-T13 and TL. T1 and T2 are connected to positive voltage source VDD and receive the positive and negative data inputs constituting the differential output voltage of an associated comparator 13. T3, T4, T5 and T6 are cross-coupled as shown and constitute a latch and regenerative amplifier. TL is a current source clocked by clock C. T9, T10, T11 and T12 constitute buffers that receive the outputs of the amplifier T3-T6. T13 constitutes an equalizing means.

In operation, during a clock cycle, if clock C is low (at ground level), T7 and T8 will precharge nodes A and B, respectively, to the full VDD level. T13 will then be on to insure that the nodes A,B are at equal potential; and current source TL will be off. The differential input voltage from the associated comparator 13 is converted to a differential current that is used to offset nodes A and B when clock C goes from ground to VDD level.

Once current source TL is gated on by clock C, the offset differential voltage at nodes A and B will be amplified and restored to a digital value corresponding to full CMOS level, and further buffered by inverters T9, T10 and T11,T12. The outputs from T9, T10 and T11,T12 are normally at ground level during the precharge mode of the clock cycle of clock C; hence T16 and T17 of transfer gate 21 will be off at that time. T16 or T17 will be turned on only in response to a full CMOS level signal.

With the amplifier T3-T6 of dynamic latch 20 in active mode, T16 or T17 and hence transfer gate 21 will turn on or off depending upon the state of the amplifier output. Hence the transfer gate 21 is self-timed, and no race condition can occur. Gate 21 converts the differential outputs from amplifier T3-T6 to a single level, and also minimizes the possibility of a signal in a metastable state being passed to static latch 22.

The sequentially connected inverter amplifier pair A1,A2 with feedback from A2 to A1 constitute a conventional static latch. The output from A2 is fed to T18 and T19. L2 clock B is connected to T18 and the input to inverter amplifier A3, the output of which is input to T19. T18, T19 and A3, as interconnected, thus constitute a transfer gate L1 to the inverter amplifier pair A4,A5 which, like A1,A2, are interconnected to constitute the L2 static latch 15.

According to an important feature of the invention, T3-T6 of the dynamic latch 20 are designed such that nodes A and B will be at a level that will cause both output buffers T9, T10 and T11,T12 to go to voltage level VDD if the offset signal is too small to be distinguished. If this condition occurs, L1 static latch 22 will be forced to a predetermined authorized, non-metastable logic level. As soon as the amplified signal is transferred by transfer gate 21 from dynamic latch 20 to static latch 22, it will be ready to be transferred to L2 static latch 15 when triggered by the leading edge of the next pulse from clock B.

As earlier noted, the latches L1,L2 as combined drastically reduce the statistical probability of metastability in the thermometer code outputs to the respective AND gates 30.

While the invention has been shown and described with respect to a preferred embodiment thereof, it will be understood by those skilled in the art that changes in form and detail may be made without departing from the scope and teaching of the invention. Accordingly, the analog-to-digital converter and method herein disclosed are to be considered merely as illustrative, and the invention is to be limited only as specified in the claims.

We claim:

1. An analog-to-digital converter with minimized metastability, comprising:
    a plurality of bipolar comparators, each providing from an analog input signal a differential output signal;
    a plurality of latch means, providing from the output signal of a corresponding comparator a respective one of a plurality of preselected equal-step binary levels, each latch means comprising,
        an edge-triggered dynamic latch for sensing and amplifying a respective one of said output signals to CMOS level;
        a static latch; and
        transfer gate means responsive solely to the output of the dynamic latch for transferring the respective one of said output signals from the dynamic latch to said static latch only if such output signal is not metastable; and
    a plurality of AND gates for receiving the data from the latch means in the form of a thermometer code based on the binary levels and translating the thermometer code into a one hot code.

2. A method of converting analog data to digital comprising the steps of:
    using a plurality of bipolar comparators, providing from analog input data a plurality of differential output signals;
    sensing and amplifying to CMOS level each output signal using a respective edge-triggered dynamic latch for providing a thermometer code;
    transferring each output signal from a respective dynamic latch to a corresponding static latch only if such signal is not metastable;
    transferring the output signal from each respective static latch to an associated second static latch further to reduce the probability of metastability;
    providing a plurality of AND gates, each having a preselected number, which is at least three, of inputs that consist of combinations of a preselected number of adjacent binary levels that are output as a thermometer code from said second static latches for converting the data from thermometer code into a cone hot code.

3. An analog-to-digital converter with minimized metastability, comprising:
    a plurality of bipolar comparators, each providing from analog input data a differential output signal;
    a plurality of latch means, each providing from the signal of a corresponding comparator a respective one of a plurality of preselected equal-step binary levels, each latch means comprising,
        a dynamic latch for sensing and amplifying a respective one of said signals to CMOS level;
        a static latch;
        transfer gate means for transferring the respective one of said signals from the dynamic latch to said static latch only if such signal is not metastable; and
    a second static latch for receiving the output of the first-mentioned static latch to further decrease the probability of metastability; and
    a plurality of AND gates, each having a preselected number, which is at least three, of inputs from said second static latches that consist of combinations of said preselected number of adjacent binary levels that are output as a thermometer code by the plurality of latch means in combination for translating the data from thermometer code into a one hot code.

4. The analog-to-digital converter of claim 3, wherein only a single one hot code will be output from the AND gates so long as two "1" outputs from the latch means are not more binary levels apart than the preselected number of AND gate inputs less two.

5. The analog-to-digital converter of claim 3, wherein the dynamic latch latches data at a preselected edge of a sampling clock pulse.

6. The analog-to-digital converter of claim 3, including separate clocks for triggering the dynamic latch and second static latch to latch data at preselected edges of their respective clock pulses.

7. The analog-to-digital converter of claim 3, including:
    means sequentially linking the binary output of each second static latch as input to an adjacent dynamic latch; and
    means including a separate scan clock for enabling input to said dynamic latch of selectable binary scan data corresponding to a desired thermometer code or code sequence under control of said clock for facilitating level sensitive scan design testing.

8. The analog-to-digital converter of claim 3, including:
    means for encoding the data from said one hot code into a preselected number of binary bits corresponding to said one hot code.

9. An analog-to-digital converter with minimized metastability, comprising:
    a plurality of bipolar comparators, each providing from analog input data a differential output signal;
    a plurality of latch means, each providing from the signal of a corresponding comparator a respective one of a plurality of preselected equal-step binary levels, each latch means comprising,
        a dynamic latch for sensing and amplifying a respective one of said signals to CMOS level;
        a static latch; and transfer gate means for transferring the respective one of said signals from the dynamic latch to said static latch only if such signal is not metastable;

a plurality of AND gates, each having a preselected number, which is at least three, of inputs that consist of combinations of said preselected number of adjacent binary levels that are output as a thermometer code by the plurality of latch means in combination for translating the data from thermometer code into a one hot code;

means sequentially linking the binary output of each latch means as input to an adjacent latch means; and means including a separate scan clock for enabling input to said latch means of selectable binary scan data corresponding to a desired thermometer code or code sequence under control of said clock for facilitating level sensitive scan design testing.

* * * * *